United States Patent
Toyama

(10) Patent No.: US 6,694,500 B2
(45) Date of Patent: Feb. 17, 2004

(54) DESIGN CIRCUIT PATTERN FOR TEST OF SEMICONDUCTOR CIRCUIT

(75) Inventor: Nobuhito Toyama, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/961,797

(22) Filed: Sep. 24, 2001

(65) Prior Publication Data

US 2002/0075028 A1 Jun. 20, 2002

(30) Foreign Application Priority Data

Sep. 26, 2000  (JP) ...................................... 2000-292172

(51) Int. Cl.$^7$ .............................................. G06F 17/50
(52) U.S. Cl. ................................ 716/8; 716/1; 716/20; 716/21; 716/7; 716/4
(58) Field of Search ........................... 716/8, 1–7, 9–21

(56) References Cited

U.S. PATENT DOCUMENTS

| | | | | |
|---|---|---|---|---|
| 5,546,406 A | * | 8/1996 | Gillenwater et al. | 714/733 |
| 5,877,648 A | * | 3/1999 | Suzuki | 327/401 |
| 5,894,483 A | * | 4/1999 | Kaminski | 714/735 |
| 6,081,916 A | * | 6/2000 | Whetsel, Jr. | 714/727 |
| 6,189,115 B1 | * | 2/2001 | Whetsel | 714/28 |
| 6,272,653 B1 | * | 8/2001 | Amstutz | 714/724 |
| 6,304,987 B1 | * | 10/2001 | Whetsel, Jr. | 714/724 |
| 6,425,117 B1 | * | 7/2002 | Pasch et al. | 716/21 |
| 6,449,757 B1 | * | 9/2002 | Karniewicz | 716/7 |
| 2002/0028523 A1 | * | 3/2002 | Toyama et al. | 438/14 |
| 2002/0044053 A1 | * | 4/2002 | Seki | 340/527 |
| 2002/0047724 A1 | * | 4/2002 | Marshall et al. | 324/765 |
| 2002/0110742 A1 | * | 8/2002 | Toyama et al. | 430/5 |

FOREIGN PATENT DOCUMENTS

JP        9-36191         2/1997
JP        2000-298683    10/2000

* cited by examiner

Primary Examiner—Matthew Smith
Assistant Examiner—Magid Y Dimyan
(74) Attorney, Agent, or Firm—Flynn, Thiel, Boutell & Tanis, P.C.

(57) ABSTRACT

At a level in which high density and miniaturization of wiring of integrated circuits is required to such an extent that optical proximity effect and the correction of optical proximity effect is necessary, a test design pattern having many test patterns corresponding to design conditions is produced, wherein each test pattern can be evaluated at a practical level. A design circuit pattern for test of a semiconductor circuit comprises a circuit pattern having a plurality of circuits formed on a semiconductor wafer wherein each of the circuits is designed for test according to an individual design condition as the object of electrical measurement. The design circuit pattern for test of a semiconductor circuit comprises a group of test cells each formed of a circuit of the object of electrical measurement and evaluation formed according to individual conditions and having a switch or switches connected with on one end or both ends thereof. A decoder generates on/off signals for a switch or switches provided within the group of test cells for specifying an evaluated test cell chosen from the group of test cells for electrical measurement and evaluation. One or more address pads provide electrical signals for specifying the evaluated test cell to the decoder. An input pad provides an electrical input signal of the evaluated test cell and an output pad outputs an electrical output signal of the evaluated test cell. One or more contrastive evaluated test cells are provided apart from the group of test cells. A contrastive evaluated input pad for inputting electrical signals is directly connected with one end of the contrastive evaluated test cells and is provided for every contrastive evaluated test cell. A contrastive evaluated output pattern for obtaining electrical signals is directly connected with the other end of the contrastive evaluated test cells and is provided for every contrastive evaluated test cell.

16 Claims, 6 Drawing Sheets

241
242
243

244
245
246

213  212  212  214
251

213  212  252a  252  212  214

213  212  253a  253  212  214

DESIGN CIRCUIT PATTERN FOR TEST OF SEMICONDUCTOR CIRCUIT

BACKGROUND OF THE INVENTION

1. Field of the Invention

The present invention relates to a circuit pattern designed for test of a semiconductor circuit in which each of a plurality of circuits formed on a semiconductor wafer according to individual design conditions are the object of electrical measurement and evaluation.

In particular, the present invention relates to the technique of evaluation of the production of semiconductor used when a difference between a design pattern and a circuit pattern formed on a wafer comes out according to design condition so that the correction or reformation of design pattern designed for the production of semiconductor is needed.

2. Description of the Related Art

In recent years, higher integration and function were being requested for various LSI (large scale integrated circuits) typified by ASIC (application specific integrated circuits) from the tendency for the electrical device to be made highly functional, lightweight, thin, short and small. Namely, it is desired to make chip size as small as possible to realize high function for LSI such as ASIC.

The above-mentioned LSI such as ASIC is formed through several steps for the production of semiconductor device of forming figure data which is also called "pattern data" for the production of photomask pattern through functional design, logic design, circuit design and layout design, forming photomask using the figure data and thereafter transferring pattern of the photomask onto a wafer by demagnification projection.

Photomask is generally formed using the above-mentioned figure data (pattern data) and through steps of writing the figure data on photosensitive resist put on the shading film of photomask substrate (it is also called "photomask blanks") by means of electron beam exposure system or aligner of photo such as excimer wavelength, developing and etching.

Namely, photomask having a desired metallic thin film pattern can be obtained through the following steps of: applying photosensitive resist on a photomask substrate provided with a shading metallic thin film on a one face of a glass substrate, and drying the photosensitive resist; applying ionizing radiation only to the given area by means of aligner to form a latent image; developing the photosensitive resist with latent image to obtain a resist pattern with a desired shape corresponding to the area to which ionizing radiation is applied; and working the metallic film into the shape of resist pattern using the resist pattern as etching-proof resist by etching.

In this case, when a pattern of photomask is transferred to a wafer by demagnification projection, the photomask is also called "reticle mask".

In such a manner, a circuit pattern is formed on a wafer by transferring a pattern of photomask on a wafer by demagnification projection. However, electrical property of the circuit pattern formed on a wafer is not always determined by only the two-dimensional shape of circuit pattern, but by the three-dimensional shape of circuit pattern. Therefore, it has been carried out to form a test circuit pattern for evaluation on a wafer and evaluate the electrical property of the test circuit pattern.

Further, in a former case which can be based on the assumption that the formed circuit pattern of LSI is not made so small that a test design pattern of photomask is faithfully formed on a wafer, a scale of a test circuit pattern is small, in which the number of test cells used for the object of the specific evaluation was within several tens.

However, recently, a size of the pattern exposed (a size of the pattern exposed on a wafer) was made finer as the integration of LSI is made higher and higher so that a size of the pattern exposed approached the wavelength of rays or became smaller than the wavelength of rays exposed. Therefore, a deformation of the exposed shape called "optical proximity effect" came to arise when a pattern of photomask is transferred on a wafer through demagnification projection. As a result, there was a case where a pattern was not formed on a wafer with the same size as another pattern according to design conditions, even if the pattern is a pattern having the same size as another pattern on photomask. This influences the electrical property of circuit formed on a wafer. Accordingly, the necessity appeared that test circuit patterns must be formed both on a wafer and on a photomask, according to design conditions.

The test circuit patterns enables to appropriately correct a pattern on a photomask or to appropriately reform a design pattern on a photomask.

Further, referring to the drawings, the necessity of a circuit pattern designed for test on a wafer (hereafter, it is called "test design circuit") is explained concretely.

As shown in FIG. 7(a), in the design of semiconductor circuit, two-dimensional design pattern 201 is formed, wherein as shown in FIG. 7(b), a circuit pattern formed on a semiconductor wafer becomes a figure pattern (it is called "circuit pattern") 202 having the sectional shape different from the design pattern (a).

A section taken on line D1–D2 of design pattern 202 formed on a wafer shown in FIG. 7(b) has the shape of section shown for example indicated by numeral 204 shown in FIG. 7(c).

In order to determine the electrical property of a pattern formed on a semiconductor wafer according to the three-dimensional shape thereof, it is necessary to design a test design pattern 210 as shown in FIG. 8 as the shape of pattern on a photomask and to form a pattern on a semiconductor wafer wherein the electrical property of the pattern formed on a semiconductor wafer is evaluated.

In FIG. 8, numeral 211 designates a circuit portion of the object of evaluation and numeral 212 designates a wiring portion.

Further, in FIG. 8, numeral 213 and 214 designates pads, which are connection portions between a semiconductor wafer and an electrical measuring instrument, in which pads necessitate a least areas of 80 μm square on a semiconductor wafer for physical contact of the pads with a needle.

Pads 213, 214 are connected with circuit portion 211 wherein the object of evaluation of test pattern 210 through wiring portions 212 which are wirings with secure thickness for the electrical connection to the circuit portion 211.

Design rule of semiconductor circuit is determined by evaluating the electrical property of a pattern on a semiconductor wafer by the test design circuit pattern, by which design based on the two-dimensional information is made possible.

However, from the latter half of the 1990s, the meaning of "test design circuit pattern" begins to change, as the technique for forming a pattern with a size smaller than the wavelength of rays from semiconductor exposure is extensively carried out.

FIG. 9(a) shows design patterns including figures with the size smaller than the wavelength of rays from a semiconductor exposurer or exposure device. FIG. 9(b) shows an example of a pattern formed on a semiconductor wafer by projecting the design pattern onto a semiconductor wafer by demagnification projection.

This is called optical proximity effect wherein a pattern cannot be formed on a semiconductor wafer as the design pattern.

In FIG. 9(a) numerals 221, 222 and 223 designate design patterns. In FIG. 9(b), numerals 224, 225 and 226 designate patterns on a wafer corresponding to design patterns 221, 222 and 223, respectively.

FIG. 10(a) shows patterns provided with correction patterns at corners thereof so as to reduce deformations caused by optical proximity effect. FIG. 10(b) shows patterns with the shape being near to the objective shape of pattern formed by projecting the design patterns shown in FIG. 10(a) onto a semiconductor wafer by demagnification projection, which is called "optical proximity effect correction technique".

In FIG. 10(a), numerals 241, 242 and 243 designate design patterns. In FIG. 10(b), numerals 244, 245 and 246 designate patterns formed on a wafer corresponding to design patterns 241, 242 and 243.

In such a manner, actual patterns formed on a semiconductor wafer are slightly different from the corresponding design patterns. This explanation is based on the figure pattern of a photomask formed from a design pattern not being formed faithfully to the design pattern. Thus, in this stage, the meaning of "test design pattern" began to change.

Namely, a former test design circuit pattern was supposed to be formed faithfully on a semiconductor wafer, and the electrical property of circuit pattern formed on a semiconductor wafer was extracted on the basis of the above-mentioned assumption.

However, when a figure with a size smaller than the wavelength of rays from a semiconductor exposurer is formed, a difference between a circuit pattern formed on a semiconductor wafer and a test design pattern arises, according to many conditions such as arrangement and density of figures in the test design pattern, a method of optical proximity effect correction, and a method of forming phase shift mask data.

Therefore, the above-mentioned conditions are set as much as possible in a test design circuit pattern, and the object thereof became to evaluate how circuit patterns are formed on a semiconductor wafer.

Referring to FIGS. 11(a)–11(c), this is explained.

FIGS. 11(a), (b), (c) show circuit patterns formed on a semiconductor wafer (they are also called "test cells"). If circuit portions 251, 252, 253 for which electrical measurement and evaluation are carried out are formed on a wafer according to design patterns, the same circuit patterns should be formed so that the same electrical properties should be obtained for the respective circuit portions. However, optical proximity effect seen when demagnification projection is made is brought about differently according to the arrangement of figures and densities thereof in a design pattern for the respective circuit patterns. Therefore, circuit portions 251, 252, 253 cannot be formed on a wafer according to a design pattern so that the same circuit patterns result. Therefore, the same electrical properties cannot be obtained for the respective circuit portions.

Therefore, it is needed to consider pattern density in design patterns. Accordingly, varied design circuit patterns for test of a semiconductor circuit are needed in which distances between circuit figures formed on a wafer are varied little by little.

Namely, it is needed to form test design circuit patterns on a semiconductor wafer through design patterns for test by demagnification projection and electrically connecting a measuring instrument to the test design circuit patterns to evaluate the electrical properties thereof.

In FIGS. 11(a)–11(c), numeral 212 designates a wiring portion, numeral 213 designates an input signal pad, numeral 214 designates an output signal pad, and numeral 252a and 253a designates additional pattern portions.

As mentioned hereinabove, up to now, when it was not so much progressed to make wirings of circuit highly dense and minute, the assumption was possible that design circuit patterns for test are formed on a semiconductor wafer faithfully to test design patterns. Therefore, the scale of test design patterns was very small. The number of test cells used for the specific subject of evaluation was dozens at the most. In recent years, it has been progressed to make wirings of circuit highly dense and minute so that optical proximity effect and the correction of optical proximity effect are needed for the production of circuit formed on a wafer. Therefore, the shape of patterns formed on a semiconductor changes according to design conditions. As a result, it became difficult to obtain desired shape of patterns.

Accordingly, in recent years, a design circuit pattern for test including conditions of design as much as possible has come to be needed.

According to this, it is an object of the present invention to provide design circuit patterns for test having many test patterns corresponding to design conditions, in which optical proximity effect and the correction of optical proximity effect are needed for the production of circuits on a wafer, wherein the design circuit pattern for test makes it possible to evaluate each test pattern at the practical level.

Namely, if a pattern formed on a semiconductor is provided with test pads wherein the test pads are needed at least two for every individual test cell in case of a pattern formed on a semiconductor wafer being a minute figure with the size of pattern under 0.2 $\mu$m, the ratio of area of test pads to the area of test design pattern becomes predominant. Therefore, a test design pattern in which many design conditions are included is not practicable because of limitations of the whole area of the test design pattern. Further, when a circuit pattern with many design conditions is formed on a semiconductor wafer in such a way, many delicate works such as the connection of respective pads with an electrical measuring instrument through a needle are needed. Therefore, there is a problem that evaluation works are increased. The present invention provides a design circuit pattern for test to solve the above-mentioned problems.

SUMMARY OF THE INVENTION

An arrangement for testing a design circuit pattern applied to a semiconductor circuit for the present invention comprises a circuit pattern having a plurality of circuits formed on a semiconductor wafer wherein each of the circuits is designed for test according to an individual design condition as the object of electrical measurement and evaluation. The circuit pattern on the semiconductor wafer comprises a group of two or more test cells, wherein each of the test cells formed from the individual design conditions corresponding to respective ones of the design circuit patterns for the object of electrical measurement and evaluation are formed according to individual conditions and have a switch or switches connected at one end or both ends thereof. A decoder generates on/off signals to the switch or switches provided within the group of test cells for specifying an evaluated test cell chosen from the group of test cells for electrical measurement and evaluation. One or more of address pads input an electrical signal specifying the evaluated test cell to the decoder. An input pad provides an electrical input signal to the evaluated test cell. An output pad receives an electrical output signal from the evaluated test cell. One or more of the contrastive evaluated test cells are provided corresponding to the group of test cells. A contrastive evaluated input pad directly connected with one end of the contrastive evaluated test cell and provided for each of the contrastive evaluated test cells provides an input signal and a contrastive evaluated output pad directly connected with the other end of the contrastive evaluated test cell and provided for each of the contrastive evaluated test cells outputs an electrical signal.

An arrangement for testing design circuit patterns applied as a semiconductor circuit of the present invention comprises a circuit pattern having a plurality of circuits formed on a semiconductor wafer wherein each of the circuits is designed for test according to an individual design condition as the object of electrical measurement and evaluation. The circuit pattern on a semiconductor wafer comprises a group of two or more test cells formed by individual design conditions corresponding to respective ones of the design circuit patterns for the object of electrical measurement and evaluation. A switch or switches are connected with one end or both ends of the test cells. A decoder for generating an on/off signal to the switch or switches is provided with the group of test cells for specifying an evaluated test cell chosen from the group of test cells for electrical measurement and evaluation. A counter circuit generates an electrical signal for a decoder specifying the evaluated test cell. A reset pad initializes the counter circuit. A clock pad operates the counter circuit. An input pad provides an electrical input signal to the evaluated test cell and an output pad receives an electrical output signal from the evaluated test cell. One or more contrastive evaluated test cells are provided in addition to the group of test cells. A contrastive evaluated input pad directly connected on one end of the contrastive evaluated test cell and provided for each of the contrastive evaluated test cells inputs an electrical signal. An output pad directly connected with the other end and provided for each of the contrastive evaluated test cells receives an electrical signal.

Further, in the above-mentioned invention, the circuits of the object of electrical measurement and evaluation arranged according to individual condition are characterized by additional circuit patterns corresponding to additional design conditions arranged around the existing respective circuits.

By having the above-mentioned construction, the present invention makes possible the provision of a design pattern for test having many test circuit patterns corresponding to design conditions, wherein each test circuit pattern can be evaluated at practical level.

The present invention includes a construction in which a switch is provided at a measuring end of individual test cells and a decoder is provided in which a signal for selecting an individual test cell is generated outside of a group of test cells and the desired test cell is specified by the signal sent through a switch provided at a measuring end of the individual test cell. Therefore, many test cells can be arranged in a test design pattern, while the number of pads can be lessened, so that a large area is unnecessary for the whole circuit pattern tested.

In the present invention, it is sufficient to have two pads for input and for output, since the mutual measuring end of the respective test cells is possible for measurement of electrical properties.

Further, by providing an input signal to a decoder from an address pad or a counter, if the number of test cells is tn, it is sufficient for the input signal of the decoder to be log 2 (tn).

Further, the present invention comprises, in addition to a group of test cells, one or more of contrastive or contrasting evaluated test cells, a contrastive evaluated input pad connected at one end of the contrastive evaluated test cell and provided for each of the contrastive evaluated test cells for providing electrical signal, and a contrastive evaluated output pad connected at the other end of the contrastive evaluated test cell and provided for every one of the contrastive evaluated test cells for obtaining electrical signal. Accordingly, it is possible to make the measurement and evaluation considering a change of electrical properties caused by a switch when determining electrical properties or a change of electrical properties caused by the mutual measuring end of the respective test cells.

Particularly, in the present invention, no change in a contact point of a needle connected with a measuring instrument with a pad is needed, when determining electrical properties.

Further, in case of the construction of the present invention in which a decoder and a counter are used, the operation of the counter can be associated with a test cell of the object of measurement. Accordingly, it becomes easy to make the statistical analysis on the basis of result of measuring of electrical properties of more test cells.

PREFERRED EMBODIMENT OF THE INVENTION

Figure 1:
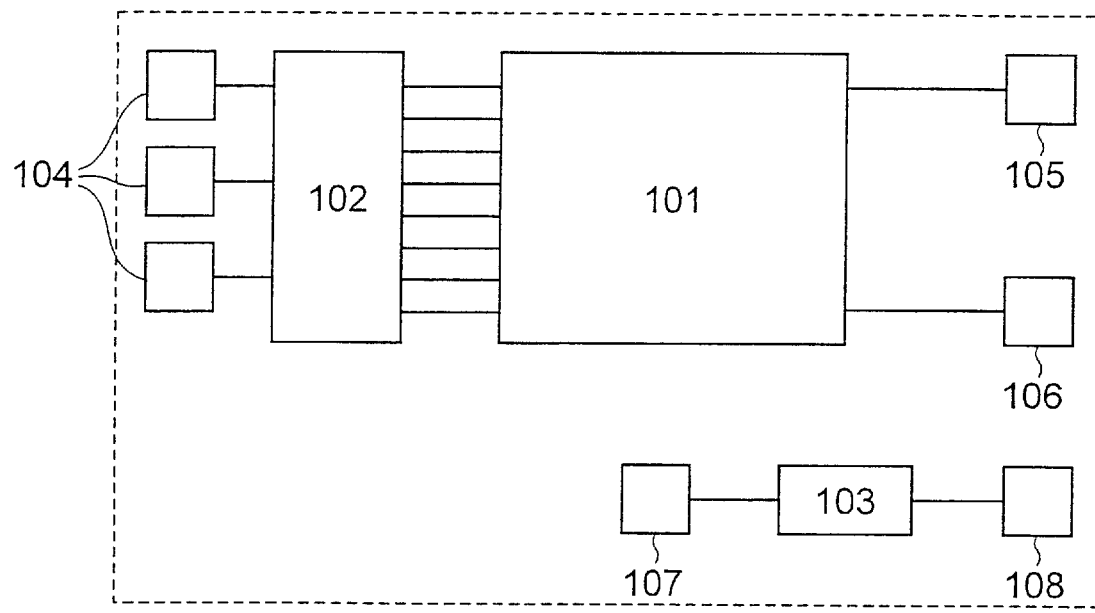
FIG. 1 is a schematic representation showing the construction of a first example of mode of working of a design circuit pattern for test of a semiconductor circuit of the present invention.

Referring to the drawings, examples of working modes of the design circuit pattern for testing of semiconductor circuits according to the present invention are explained.

In FIGS. 1 to 4, 5(a)–5(d) and 6, numeral 101 designates a group of test cells, numeral 102 designates a decoder, numeral 103 designates a contrastive or contrasting test cell which is also called "contrastive evaluated test cell", numeral 104 designates a decoder input signal pad which is also called "address pad", numeral 105 designates an input signal pad which is also called "input pad", numeral 106 designates an output signal pad which is also called "output pad", numeral 107 designates an input signal pad for the contrastive test cell 103 which is also called "a contrastive evaluated input pad", and numeral 108 designates an output signal pad which is also called "contrastive evaluated output pad".

Figure 2:
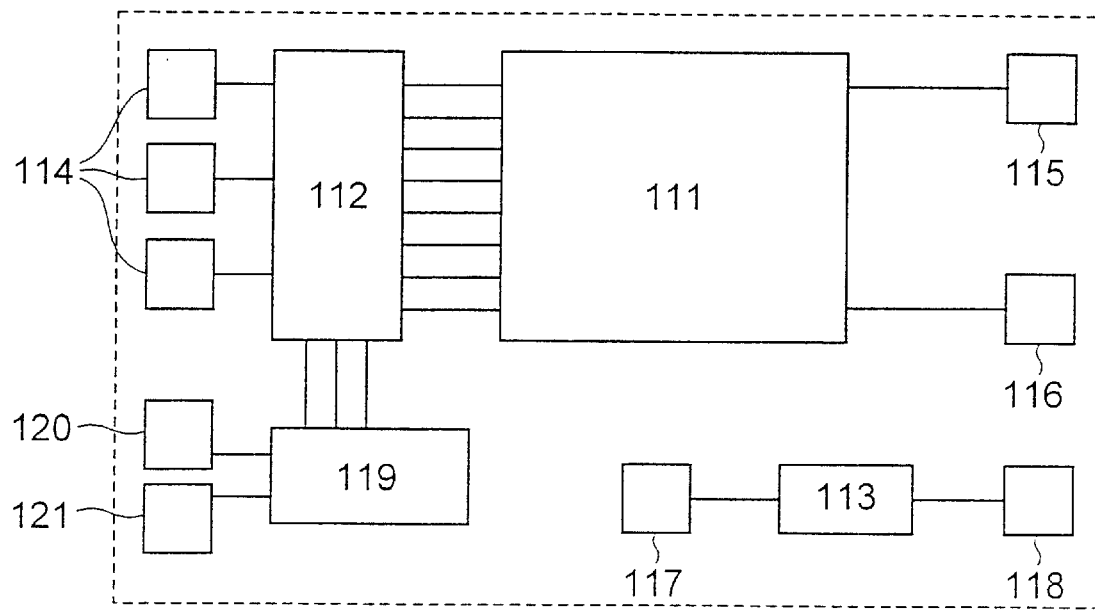
FIG. 2 is a schematic representation showing the construction of a second example of mode of working of a design circuit pattern for test of a semiconductor circuit of the present invention.

In FIG. 2, numeral 111 designates a group of test cells, numeral 112 designates a decoder, numeral 113 designates a contrastive test cell, numeral 114 designates a decoder input signal pad, numeral 115 designates an input signal pad, numeral 116 designates an output signal pad, numeral 117 designates an input signal pad for the contrastive test cell 113, numeral 118 designates an output signal pad for the contrastive test cell 113, numeral 119 designates a counter, numeral 120 designates a reset signal pad for the counter 119, and numeral 121 designates a clock signal pad for the counter 119.

Figure 3A:
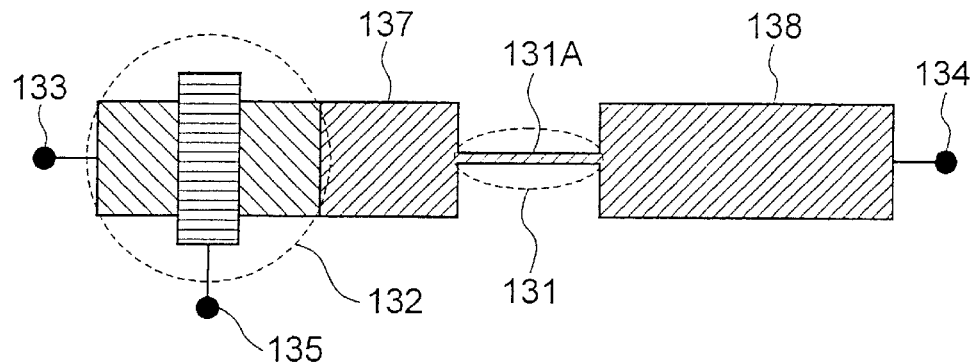
FIGS. 3(*a*) and (*b*) are schematic representations illustrating the work of electrical measurement of a test cell.
Figure 3B:
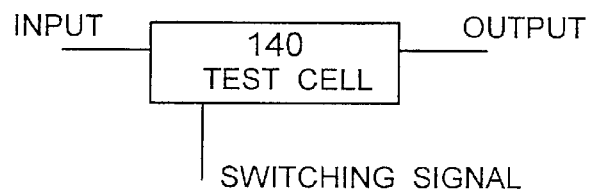

In FIG. 3(a), numeral 131 designates a circuit portion of an object of measurement and evaluation formed on a semiconductor wafer, numeral 131A designates a measured circuit portion (wiring), numeral 132 designates a switch (transistor), numeral 133 designates an input terminal for test cell, numeral 134 designates an output terminal for test cell, numeral 135 designates a switching signal terminal for test cell, and numerals 137 and 138 designate portions of wiring. In FIG. 3(b), numeral 140 designates a test cell.

Figure 4:
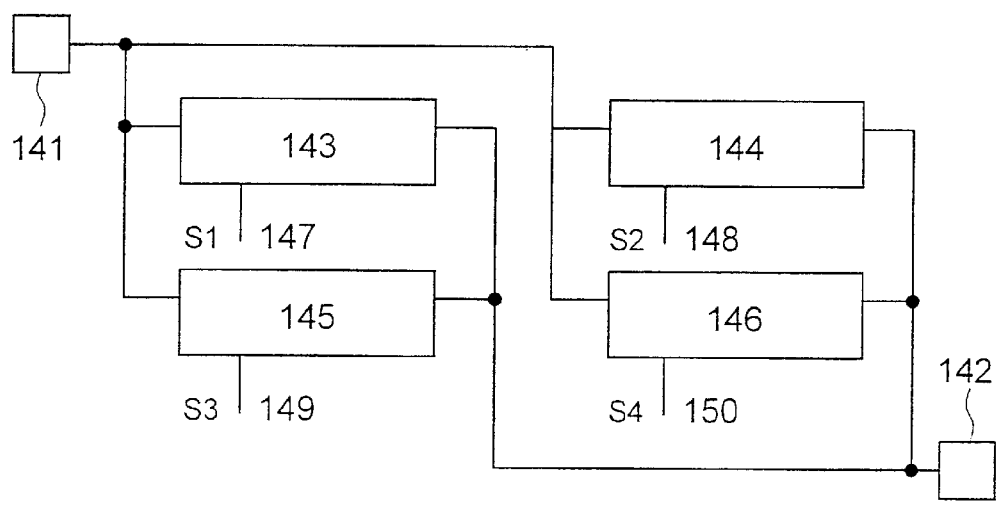
FIG. 4 is a schematic representation showing the arrangement of each cell included in a first example of a group of test cells shown in FIG. 1 and illustrating the work of measurement of each test cell.
Figure 5A:
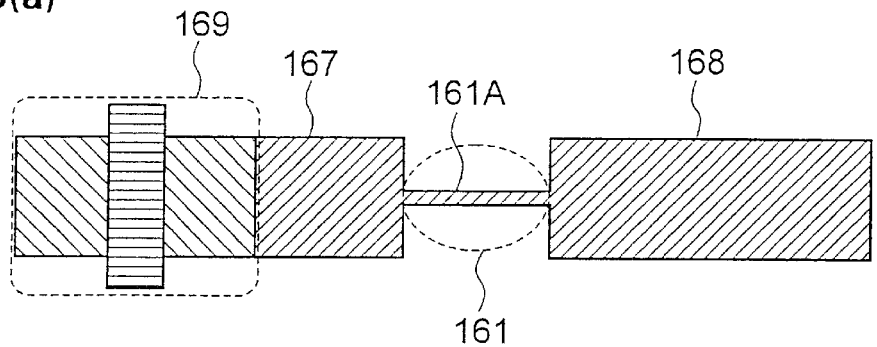
FIGS. 5(*a*), (*b*), (*c*) and (*d*) are views showing test cells of the present invention.
Figure 5B:
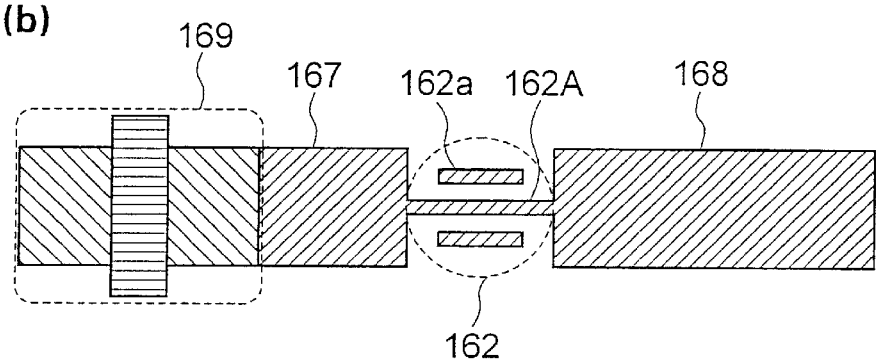
Figure 5C:
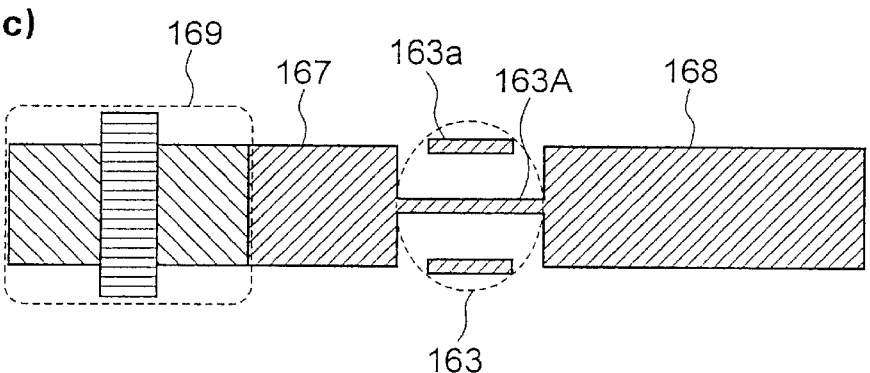
Figure 5D:
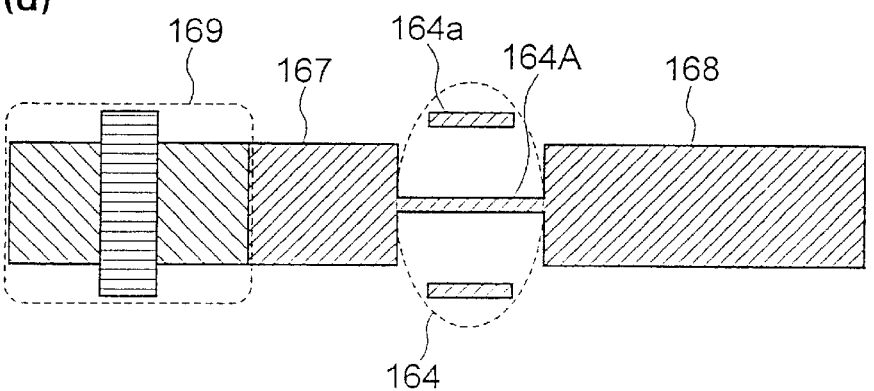

In FIG. 4, numeral 141 designates an input signal pad, numeral 142 designates an output signal pad, numerals 143 to 146 designate test cells, numerals 147 to 150 (S1 to S4) designate switch signals.

Figure 6:
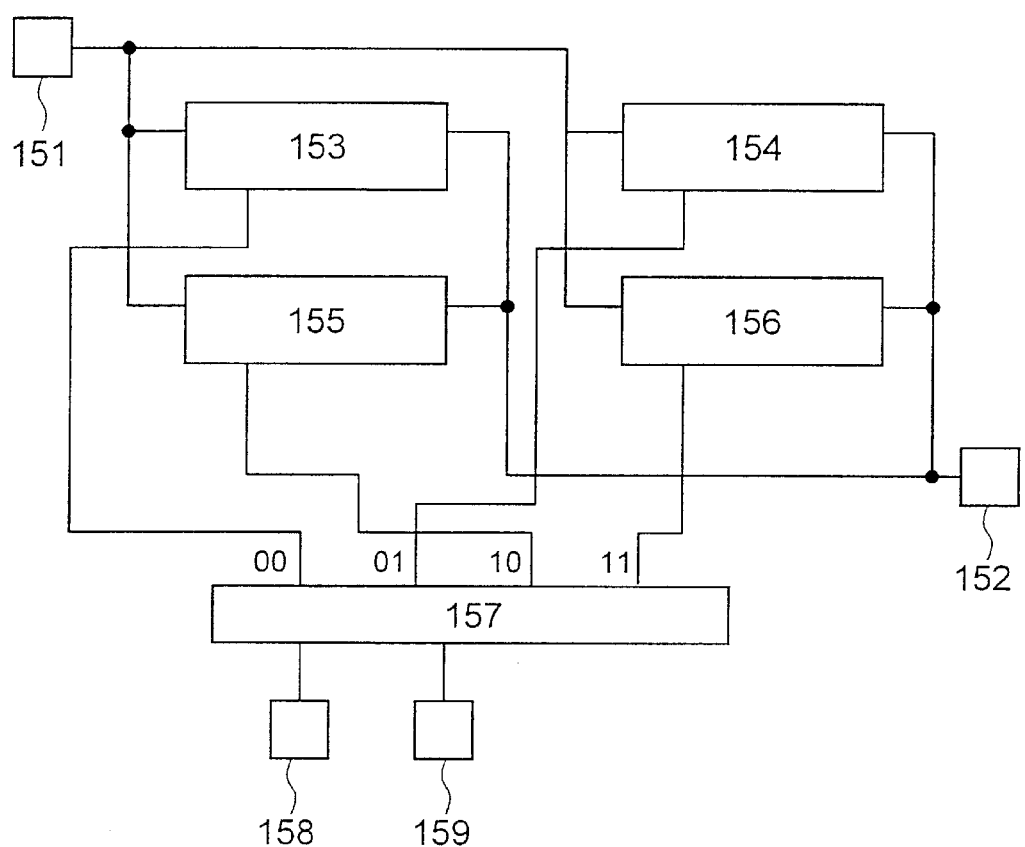
FIG. 6 is a schematic representation showing the construction that a group of test cells shown in FIGS. 5(*a*)–5(*d*) are arranged in 2×2 and connected with a decoder and with each pad.
Figure 7A:
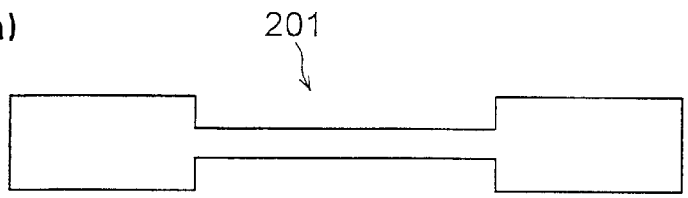
FIGS. 7(*a*), (*b*) and (*c*) are views for illustrating the difference between a design pattern (the shape of pattern formed on a photomask) and a design circuit pattern formed on a wafer.
Figure 7B:
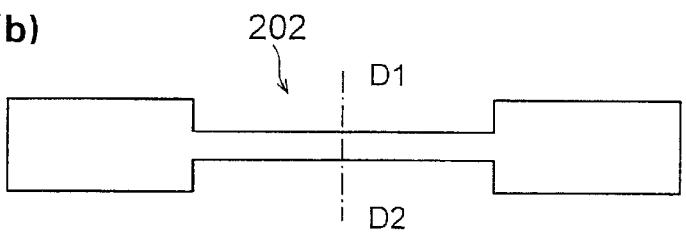
Figure 7C:
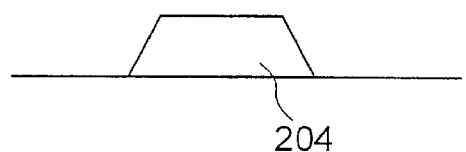
Figure 8:
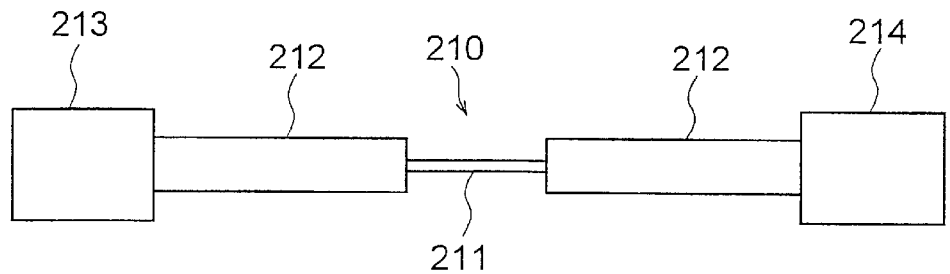
FIG. 8 is a view of a conventional test cell.
Figure 9A:
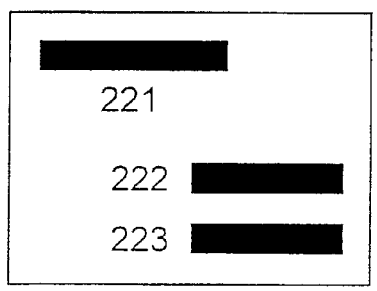
FIGS. 9(*a*) and (*b*) are views for illustrating optical proximity effect.
Figure 9B:
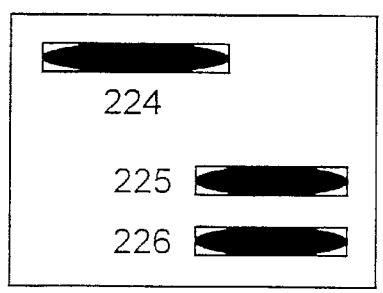
Figure 10A:
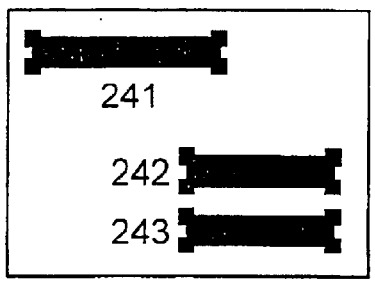
FIGS. 10(*a*) and (*b*) are views for illustrating the correction of a design circuit pattern (the shape of pattern formed on a photomask).
Figure 10B:
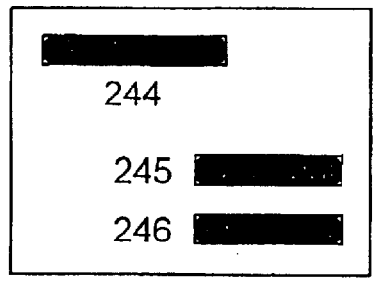
Figure 11A:
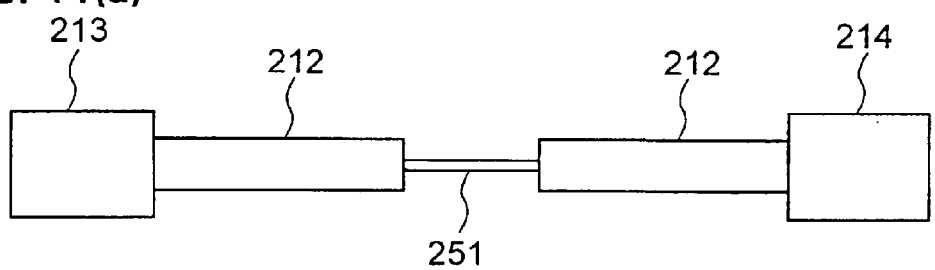
FIGS. 11(*a*), (*b*) and (*c*) are views for illustrating optical proximity effect and conventional test cells.
Figure 11B:
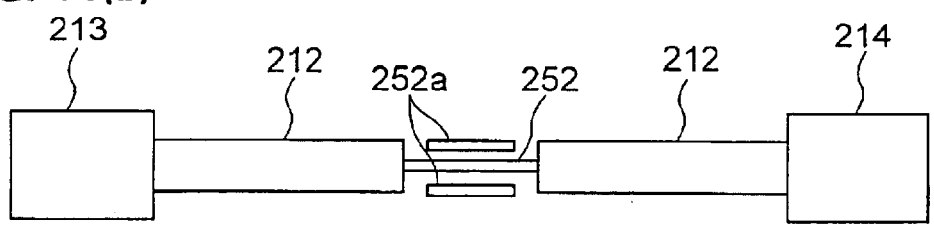
Figure 11C:
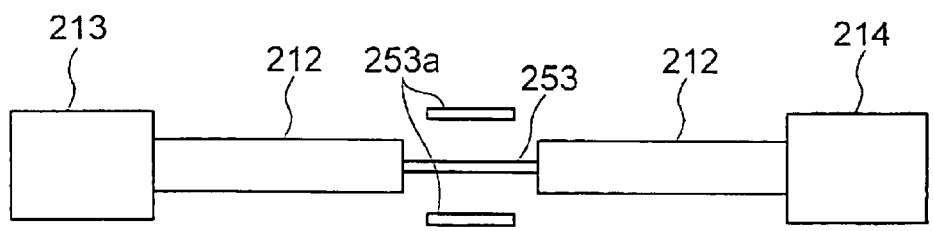

In FIG. 6, numeral 151 designates a decoder input signal pad, numeral 152 designates a decoder output signal pad, numerals 153 to 156 designate test cells, numeral 157 designates a counter, and numerals 158 and 159 designate decoder output signal pads.

In FIGS. 5(a)–5(d), numerals 161 to 164 designate circuit portions of the object of measurement and evaluation formed on a semiconductor wafer, numerals 161A to 164A designate measured circuit portions, numerals 162a to 164a designate additional patterns in which they are also called additional circuit portions or wiring portions, numerals 167 and 168 designate wiring portions and numeral 169 designates a switch (transistor).

First, referring to FIG. 1, one example of a working mode of design pattern for test of a semiconductor circuit according to the present invention is explained.

The present example is a design circuit pattern designed for test in which the electrical measurement and evaluation are made for each of a plurality of circuits formed on a semiconductor wafer and having individual design conditions, respectively.

Then, a unit as a test cell includes a circuit being an object of electrical measurement and evaluation, wherein the circuit is arranged according to individual conditions and one end or both ends of the circuit are connected with a switch or switches. The design circuit pattern is comprised of a group 101 of test cells composed of two or more of test cells, wherein a circuit of an object of electrical measurement and evaluation is arranged according to individual design conditions in each cell. Also provided is a decoder 102 for forming on/off signal to switches provided inside the group of test cells for specifying an evaluated test cell wherein one test cell is selected as the evaluated test cell from among the group 101 of test cells for the measurement and evaluation; one or more of decoder input signal pad(s) (address pad(s)) 104 for providing electrical signal for specifying the evaluated test cell to the decoder 102; an input signal pad (also called "input pad") 105 for providing an electrical input signal for the evaluated test cell; an output signal pad (also called "output signal") 106 for taking out an electrical output signal from the evaluated test cell; one or more of contrastive evaluated test cell(s) (also called "test cell(s) for contrastive") 103 provided in addition to the group 101 of test cells; one or more of contrastive evaluated input pad(s) 107 connected directly with one end of the contrastive evaluated test cell(s) 103 for providing an electrical signal, wherein one contrastive evaluated input pad 107 is provided for every contrastive evaluated test cell 103; and a contrastive evaluated output pad 108 connected directly with the other end of the contrastive evaluated test cell(s) 103 for obtaining an electrical signal, wherein one contrastive evaluated output pad 108 is provided for every contrastive evaluated test cell 103.

Test cells 143, 144, 145 and 146 in group 101 of test cells are arranged in 2 rows×2 columns as shown in FIG. 4, wherein test cells 143, 144, 145 and 146 are connected with input signal pad 141 and with output signal pad 142, through switches 147, 148, 149 and 150.

The respective test cells include switching elements 132 formed of transistors. As shown in FIG. 3(a), input 133 is fed from an input pad (pad shown with numeral 141 in FIG. 4). Only when switching signal 135 is an on signal, output 134 is obtained from a test cell of the object to be measured through an output signal pad (pad shown with numeral 142 in FIG. 4).

In this case, in test cells except the test cell of the object of measurement, switches are off so that output is not obtained from the test cells except the test cell of the object of measurement.

In FIG. 3(a), numeral 131 designates a circuit portion formed on a semiconductor wafer for measurement of electrical properties.

Further, FIG. 3(b) shows a view illustrating briefly the drawing shown in FIG. 3(a).

FIG. 6 is a view showing the construction in which decoder 157 is added to the arrangement of test cells and wiring shown in FIG. 4 and each pad 151, 152, 158, 159 is connected to the test cells and the decoder 157, respectively.

The measuring ends of the respective test cells 153 to 156 are made common through switches shown in numerals 147 to 150 in FIG. 4, which switches are not shown in FIG. 6.

Signals given in decoder pads 158, 159 are set to voltages such as 0 V, 3V. When a voltage of 0 V is defined as "0" and a voltage of 3 V is defined as "1", a connection is made between decoder 157 and one of test cells 153 to 156 according to signals given to decoder pads 158, 159.

For example, if the voltage applied to decoder signal pad 158 is 3 V and the voltage applied to decoder signal pad 159 is 0V, only test cell 155 is connected with decoder 157 so that the electrical property of test cell 155 can be measured.

In FIG. 6, outputs 00, 01, 10, 11 of decoder 157 shows the values of decoder signal pads 158, 159, respectively.

Circuit portions 161 to 164 in which states of dense or sparse arrangement of figures (circuit pattern) arranged around measured circuits 161A to 164A (design conditions of circuit pattern) are different to each other are given as test cells formed on a semiconductor wafer for measurement of electrical properties, as shown in FIGS. 5(a) to (d), wherein the test cells shown in FIGS. 5(a) to (d) are united to one group of test cells.

Measured circuits 161A to 164A for measuring electrical resistance of the respective test cells are identical to each other in design patterns i.e. (the shape of pattern formed on a photomask), which are formed by the demagnification of design patterns. However, in measured circuits 161A to 164A, intervals between the measured circuits 161A to 164A and circuits 161a to 164a arranged being adjacent to the measured circuits 161A to 164A are different to each other.

When a pattern is formed on a semiconductor wafer by optical proximity effect, a change in shape arises in circuit portions of figures 161 to 164 shown in FIGS. 5(a)–5(d) formed on a semiconductor wafer. However, the difference between figures 161 to 164 can be found by measuring electrical resistance of the electrical properties of the figures 161 to 164.

In this case, by measuring the electrical property of circuits 161 to 164, respectively, how the interval between measured circuits 161A to 164A and additional patterns around the measured circuits 161A to 164A affects the electrical property of measured circuits 161A to 164A can be found.

The same test cells as the test cells included in a group 101 of test cells are arranged as in contrastive test cell 103 shown in FIG. 1.

Electrical property is measured through pads 107, 108 connected to the contrastive test cell 103, and electrical property of the same test cell included in the group 101 of test cells as the contrastive test cell 103 is measured. Thereby, a change of electrical property caused by switches and the common use of measuring terminals and others can be obtained.

Then, referring to FIG. 2, a second example of a working mode of a design pattern for test of semiconductor circuits of the present invention is explained briefly.

The present example is also a design pattern for test in which individual circuit patterns for each test chosen from among a plurality of circuit patterns for test formed on a semiconductor wafer is the object of the electrical measurement and evaluation.

The present example comprises a decoder 112 (corresponding to decoder 102 shown in FIG. 1). Further, the present example comprises a counter circuit 119 for generating an electrical signal for the decoder 112 specifying an evaluated test cell, a reset pad 120 for initializing the counter circuit 119 and a clock pad 121 for operating the counter circuit 119, instead of decoder input signal pad 104 included in the first example shown in FIG. 1, wherein the measurement operation, test cell, a group of test cells and a group of contrastive test cells are fundamentally the same as in the first example. Therefore, the explanation is omitted.

In this case, the operation of counter circuit 119 can be associated with a test cell of the object of measurement because of the construction including a decoder signal and a counter. Accordingly, it becomes easier as compared with the first example, to make a statistical analysis on the basis of the result of measurement of electrical properties of more test cells.

The present invention enables the provision of a test design pattern having many test patterns corresponding to design conditions at the level in which the high density and miniaturization is progressed so that optical proximity effect and the correction of optical proximity effect are needed for the production of circuits on a wafer, wherein each test pattern can be evaluated at a practical level.

What is claimed is:

1. An arrangement for testing a design circuit pattern applied to a semiconductor wafer to comprise a circuit pattern having a plurality of circuits formed on the semiconductor wafer, wherein each of the circuits is designed for test according to an individual design condition as the object of measurement of electrical properties and evaluation, wherein the circuit pattern on the semiconductor wafer comprises a group of two or more test cells formed from the individual design conditions corresponding to respective ones of the plural circuits for the object of measurement of electrical properties and evaluation and having a switch or switches connected at one end or both ends thereof; a decoder for generating on/off signals to said switch or switches provided within the group of test cells for specifying an evaluated test cell chosen from the group of test cells for measurement of electrical properties and evaluation; one or more of address pads for providing an electrical signal specifying the evaluated test cell to the decoder; an input pad for providing an electrical input signal to the evaluated test cell; an output pad for receiving an electrical output signal from the evaluated test cell; one or more of contrastive evaluated test cells provided apart from the group of test cells; a contrastive evaluated input pad directly connected with one end of the contrastive evaluated test cell for inputting an electrical signal and provided for every one of the contrastive evaluated test cells; and a contrastive evaluated output pad directly connected with the other end of the contrastive evaluated test cell and provided for every one of the contrastive evaluated test cells to output an electrical signal.

2. The arrangement according to claim 1, wherein the circuits that are the object of measurement of electrical properties and evaluation, and that are arranged according to the individual design conditions are characterized by additional circuit patterns corresponding to additional individual design conditions forming additional circuits around the existing circuits.

3. The arrangement according to claim 1, wherein the circuit pattern formed as one of the circuits on the semiconductor wafer differs from the design circuit pattern applied to the wafer due to an optical proximity effect when the design circuit pattern is transferred onto the wafer through demagnification projection.

4. The arrangement according to claim 3, wherein a three-dimensional shape defining a density for the circuit pattern affects the electrical properties measured for the circuit formed on the wafer.

5. The arrangement according to claim 1, wherein the measured electrical property comprises resistance.

6. An arrangement for testing design circuit patterns applied to a semiconductor wafer to comprise a circuit pattern having a plurality of circuits formed on the semiconductor wafer, wherein each of the circuits is designed for test according to an individual design condition as the object of measurement of electrical properties and evaluation, wherein the circuit pattern on the semiconductor wafer comprises a group of two or more of test cells corresponding to the plurality of circuits formed by the individual design conditions corresponding to respective ones of the design circuit patterns for the object of measurement of electrical properties and evaluation and having a switch or switches connected at one end or both ends thereof; a decoder for generating on/off signals to said switch or switches provided within the group of test cells for specifying an evaluated test cell chosen from the group of test cells for measurement of electrical properties and evaluation; a counter circuit for providing an electrical signal to the decoder for selecting the evaluated test cell; a reset pad for initializing the counter circuit; a clock pad for operating the counter circuit; an input pad for providing an electrical input signal to the evaluated test cell; an output pad for receiving an electrical output signal from the evaluated test cell; one or more contrastive evaluated test cells provided apart from the group of test cells; a contrastive evaluated input pad directly connected on one end of the contrastive evaluated test cell for inputting an electrical signal and provided for every one of the contrastive evaluated test cells; and a contrastive evaluated output pad directly connected with the other end of the contrastive evaluated test cell for outputting an electrical signal and provided for every one of the contrastive evaluated test cells.

7. The arrangement according to claim 6, wherein the circuits that are the object of electrical measurement and evaluation and arranged according to the individual design condition are characterized by additional circuit patterns corresponding to additional individual design conditions forming additional circuits around the existing circuits.

8. The arrangement according to claim 6, wherein the measured electrical property comprises resistance.

9. An arrangement for testing a group of test cells on a semiconductor wafer, comprising:

test cells comprising independent figure patterns formed on a semiconductor wafer from independent design circuit patterns, the design circuit patterns being transferred onto the semiconductor wafer by demagnification projection, one end of each of the test cells including a switch, each of the switches having a switching terminal;

an input signal pad connected to the test cells via the switches for providing an input signal to a selected one of the test cells on the semiconductor wafer;

an output signal pad for receiving a corresponding output signal from the selected one of the test cells;

a decoder for providing an actuation signal to one of the switching terminals to actuate a selected one of the switches and enable the input signal pad to provide the input signal to the selected test cell and the output signal pad to receive the output signal from the selected test cell;

contrasting test cells corresponding to the test cells, a selected one of the contrasting test cells corresponding to the selected one of the test cells;

an input pad connected to one end of the selected contrasting test cell;

an output pad connected to the other end of the selected contrasting test cell; and a unit for measuring electrical properties of the selected test cell and electrical properties of the corresponding contrasting test cell, the contrasting test cell providing an output for contrasting to the output of the selected test cell so that any changes in the measured electrical properties caused by the respective switch for the selected test cell are corrected for by the electrical properties measured for the selected contrasting test cell, wherein deviation of the electrical properties of the independent figure patterns formed on the semiconductor wafer from the expected electrical properties for the independent design circuit patterns applied by demagnification projection is detected, the deviation being correctable by adjustments to the design circuit patterns applied to the wafer to form the figure patterns.

10. The arrangement according to claim 9, wherein the deviation is caused by an optical proximity effect when a size of the design circuit patterns exposed using an electron beam exposure technique approaches a wavelength of rays applied to the wafer by an electron beam.

11. The arrangement according to claim 9, the arrangement including a decoder input signal pad for providing signals to the decoder to select the test cell to be evaluated.

12. The arrangement according to claim 9, further comprising:

a counter connected to the decoder for controlling the selection of test cells to be evaluated;

a clock signal pad connected to the counter; and a reset signal pad connected to the counter.

13. The arrangement according to claim 9, wherein each of the test cells includes wiring at opposing ends thereof, the wiring at one end of each of the test cells being connected to a respective one of the switches.

14. The arrangement according to claim 13, wherein the switch comprises a transistor.

15. The arrangement according to claim 9, wherein a three-dimensional shape of the figure pattern affects the measured electrical properties.

16. The arrangement according to claim 9, wherein the measured electrical property comprises resistance.

* * * * *